United States Patent
Kawagoe et al.

(10) Patent No.: US 12,482,913 B2
(45) Date of Patent: Nov. 25, 2025

(54) PRINTED WIRING BOARD, MULTILAYER RESONATOR, AND MULTILAYER FILTER

(71) Applicant: KYOCERA Corporation, Kyoto (JP)

(72) Inventors: Atsuo Kawagoe, Kyoto (JP); Takashi Ishioka, Kyoto (JP); Masanori Naito, Kyoto (JP); Nobuyuki Ueda, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 219 days.

(21) Appl. No.: 18/269,137

(22) PCT Filed: Dec. 10, 2021

(86) PCT No.: PCT/JP2021/045579
§ 371 (c)(1),
(2) Date: Jun. 22, 2023

(87) PCT Pub. No.: WO2022/138242
PCT Pub. Date: Jun. 30, 2022

(65) Prior Publication Data
US 2024/0040693 A1 Feb. 1, 2024

(30) Foreign Application Priority Data
Dec. 25, 2020 (JP) .................. 2020-217149

(51) Int. Cl.
*H01P 1/203* (2006.01)
*H03H 1/00* (2006.01)
(Continued)

(52) U.S. Cl.
CPC ............ *H01P 1/20345* (2013.01); *H03H 1/00* (2013.01); *H05K 1/0298* (2013.01); *H05K 1/115* (2013.01);
(Continued)

(58) Field of Classification Search
CPC ........ H01P 1/20345; H03H 2001/0085; H05K 1/0298
(Continued)

(56) References Cited

U.S. PATENT DOCUMENTS

2004/0085153 A1* 5/2004 Fukunaga ............... H01P 5/107
333/33

FOREIGN PATENT DOCUMENTS

| CN | 109346807 A | 2/2019 |
| JP | 10-303618 A | 11/1998 |

(Continued)

*Primary Examiner* — Rakesh B Patel
(74) *Attorney, Agent, or Firm* — Volpe Koenig

(57) ABSTRACT

A printed wiring board includes a dielectric layer, a first and second conductor layer, and a plurality of via conductors. The dielectric layer has first and second opposing surfaces. The first and second conductor layer lie in the first second surfaces of the dielectric layer, respectively. Each via conductor extends through the dielectric layer and connects the first and second conductor layers to each other. Part of the printed wiring board is surrounded with the via conductors and is an overlap between the first conductor layer and the second conductor layer in a transparent plan view. When viewed in plan, the via conductors each have an aspect ratio greater than 1 and a major axis extending in a first direction and a minor axis extending in a second direction. The via conductors include a via conductor whose major axis extends and connects the via conductors arranged in a line.

7 Claims, 10 Drawing Sheets

(51) Int. Cl.
    *H05K 1/02*     (2006.01)
    *H05K 1/11*     (2006.01)

(52) U.S. Cl.
    CPC ................ *H03H 2001/0085* (2013.01); *H05K 2201/09609* (2013.01); *H05K 2201/09836* (2013.01)

(58) Field of Classification Search
    USPC ................................ 333/175, 185, 204, 205
    See application file for complete search history.

(56) References Cited

FOREIGN PATENT DOCUMENTS

| | | |
|---|---|---|
| JP | 2003-142905 A | 5/2003 |
| JP | 2004-200783 A | 7/2004 |

\* cited by examiner

PRINTED WIRING BOARD, MULTILAYER RESONATOR, AND MULTILAYER FILTER

TECHNICAL FIELD

The present disclosure relates to a printed wiring board, a multilayer resonator, and a multilayer filter.

BACKGROUND OF INVENTION

A known multilayer technique by which dielectric layers and conductor layers are layered is used in the related art for forming a multilayer resonator incorporated into a printed wiring board and forming a multilayer filter including the multilayer resonator. For example, a resonator disclosed in Japanese Unexamined Patent Application Publication No. 10-303618 includes a pair of conductor layers constituting a printed wiring board and via conductors that are disposed between the conductor layers to serve as a side wall for blocking electromagnetic waves. A region surrounded with the pair of conductor layers and the via conductors is regarded as a resonance region of the resonator. The shape of each of the via conductors in a section parallel to the conductor layers is circular.

SUMMARY

In an aspect of the present disclosure, a printed wiring board present includes a dielectric layer, a first conductor layer, a second conductor layer, and a plurality of via conductors. The dielectric layer has a first surface and a second surface opposite to the first surface. The first conductor layer lies in the first surface of the dielectric layer. The second conductor layer lies in the second surface of the dielectric layer. The plurality of via conductors each extend through the dielectric layer from the first surface to the second surface and connect the first conductor layer and the second conductor layer to each other. Part of the printed wiring board is surrounded with the plurality of via conductors and is an overlap between the first conductor layer and the second conductor layer in a transparent plan view. When viewed in plan, the plurality of via conductors each have an aspect ratio greater than 1 and each have a major axis extending in a first direction and a minor axis extending in a second direction. The plurality of via conductors include a via conductor whose major axis extends along a periphery connecting the plurality of via conductors arranged in a line.

In an aspect of the present disclosure, a multilayer resonator present includes a dielectric layer, a first conductor layer, a second conductor layer, and a plurality of via conductors. The dielectric layer has a first surface and a second surface opposite to the first surface. The first conductor layer lies in the first surface of the dielectric layer. The second conductor layer lies in the second surface of the dielectric layer. The plurality of via conductors each extend through the dielectric layer from the first surface to the second surface and connect the first conductor layer and the second conductor layer to each other. Part of the printed wiring board is surrounded with the plurality of via conductors and is an overlap between the first conductor layer and the second conductor layer in a transparent plan view. When viewed in plan, the plurality of via conductors each have an aspect ratio greater than 1 and each have a major axis extending in a first direction and a minor axis extending in a second direction. The plurality of via conductors include a via conductor whose major axis extends along a periphery connecting the plurality of via conductors arranged in a line.

In the present disclosure, a multilayer filter present includes the multilayer resonator described above.

DESCRIPTION OF EMBODIMENTS

Figure 1:
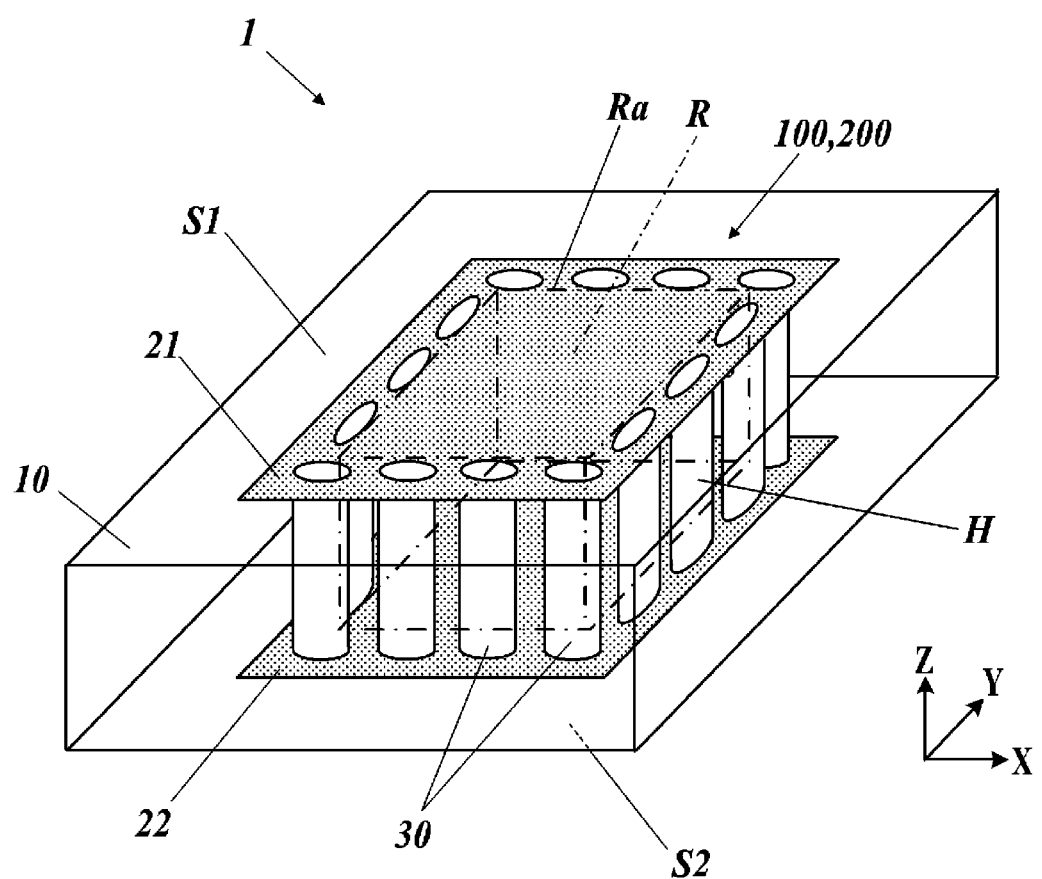
FIG. 1 is a transparent perspective view of a printed wiring board according to an embodiment.

Hereinafter, an embodiment will be described below while referring to the drawings. However, for convenience of explanation, each figure referred to below illustrates only the main components that are necessary to explain the embodiment in a simplified manner. Accordingly, a printed wiring board 1 of the present disclosure may include any components not illustrated in the referenced figures. The dimensions of the components in each figure are not a faithful representation of, for example, the actual dimensions and dimensional proportions of the components.

Configuration of Printed Wiring Board

The configuration of a printed wiring board 1 according to the present embodiment will be described while referring to FIG. 1.

The printed wiring board 1 is a multilayer antenna substrate incorporating an antenna, transmission lines, and the like. The antenna is used for a millimeter-wave radar or the like, and signals received by the antenna are transmitted through the transmission lines. The printed wiring board 1 includes a multilayer filter 200 and a multilayer resonator 100 therein. Transmission signal components corresponding to a predetermined frequency band pass through the multilayer filter 200. The multilayer filter 200 includes the multilayer resonator 100. Illustration of antenna electrodes and other constituent elements other than the multilayer resonator 100 and the multilayer filter 200 is omitted in FIG. 1. Hereafter, the orientations of the individual parts of the printed wiring board 1 are described using an XYZ Cartesian coordinate system in which the Z direction is equivalent to the thickness direction of the printed wiring board 1. A surface of each layer constituting the printed wiring board 1 facing in the +Z direction is also referred to as an "upper surface" and a surface facing in the −Z direction is also referred to as a "lower surface". The Z direction is also referred to as a "thickness direction" of the printed wiring board 1.

The printed wiring board 1 includes a dielectric layer 10, a first conductor layer 21, a second conductor layer 22, and via conductors 30.

The dielectric layer 10 is a plate-like member made of a dielectric material. The dielectric layer 10 may be a structure in which dielectric members are layered in the Z direction. The dielectric layer 10 may have a rectangular parallelepiped shape. An upper surface and a lower surface (opposite to the first surface S1) of the dielectric layer 10 are hereinafter referred to as a first surface S1 and a second surface S2, respectively. The term viewed in plan is herein used when a constituent member is viewed in a direction perpendicular to the first surface S1.

The material of the dielectric layer 10 is not particularly limited as long as the material has an insulating property. Examples of the material of the dielectric layer 10 include epoxy resin, bismaleimide-triazine resin, polyimide resin, polyphenylene ether (PPE) resin, phenolic resin, polytetrafluoroethylene (PTFE) resin, silicone resin, polybutadiene resin, polyester resin, melamine resin, urea resin, polyphenylene sulfide (PPS) resin, and polyphenylene oxide (PPO) resin. Two or more of these resins may be mixed. The dielectric layer 10 may contain a reinforcing material, such as glass cloth. The dielectric layer 10 may also contain an inorganic filler, such as aluminum hydroxide, silica, or barium sulfate, or may contain an organic filler, such as phenolic resin or methacrylate resin.

The first conductor layer 21 lies in the first surface S1 of the dielectric layer 10 and at least partially overlaps a resonance region R (a predetermined region) when viewed in plan. FIG. 1 exemplifies a configuration in which the first conductor layer 21 is provided over the entirety of the resonance region R when viewed in plan. The material of the first conductor layer 21 may be, for example, but not limited to, copper.

The resonance region R in FIG. 1 is a rectangular parallelepiped region. The resonance region R viewed in plan has a periphery Ra, which defines a rectangular shape made up of two parallel sides extending in the X direction and two parallel sides extending in the Y direction. The resonance region R extends from the first surface S1 to the second surface S2 in the Z direction. In other words, the resonance region R is surrounded with the via conductors 30 and is located at an overlap between the first conductor layer 21 and the second conductor layer 22 in a transparent plan view. The shape of the resonance region R is not limited to the shape illustrated in FIG. 1. For example, the resonance region R may have a polygonal shape other than a rectangular shape, a circular shape, or the like when viewed in plan.

The second conductor layer 22 lies in the second surface S2 of the dielectric layer 10 and at least partially overlaps the resonance region R when viewed in plan. FIG. 1 exemplifies a configuration in which the second conductor layer 22 is provided over the entirety of the resonance region R when viewed in plan. The material of the second conductor layer 22 may be, for example, but not limited to, copper.

Figure 2:
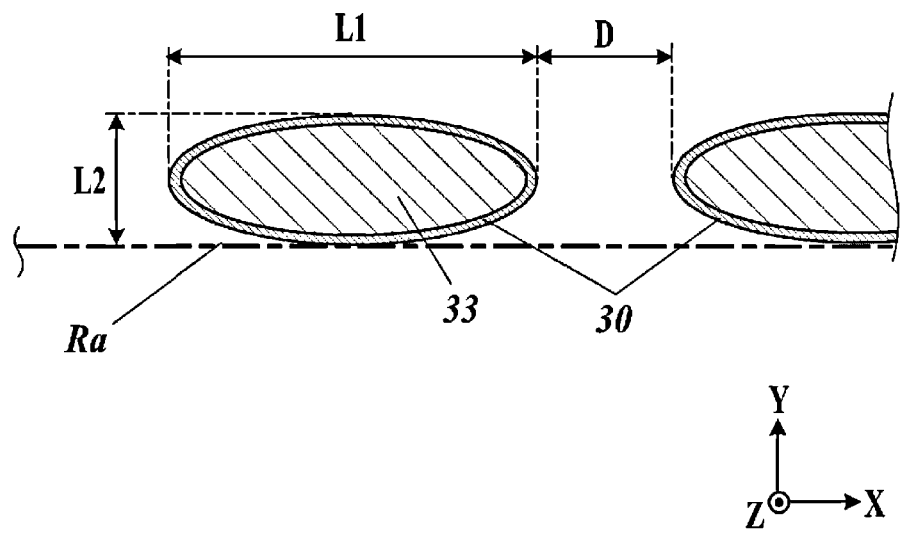
FIG. 2 is a view of via conductors, each of which being elliptical in a section.

The via conductors 30 are arranged so as to surround the resonance region R along the periphery Ra of the resonance region R when viewed in plan. The via conductors 30 each extend through the dielectric layer 10 in the thickness direction from the first surface S1 to the second surface S2. The via conductors 30 are electrically connected to the first conductor layer 21 and the second conductor layer 22. In other words, the via conductors 30 form a connection between the first conductor layer 21 and the second conductor layer 22. More specifically, the dielectric layer includes via holes H, each of which is provided for the respective formation position of the via conductors 30 and is in the form of an elliptical column. Each of the via conductors 30 is composed of a conductor formed on an inner wall of the corresponding one of the via holes H. That is, each of the via conductors 30 is in the form of an elliptical cylinder. Thus, each of the via conductors is elliptical in a section parallel to the first surface S1 as illustrated in FIG. 2. The material of the via conductors 30 may be, for example, but not limited to, copper. The via conductors 30 may be placed at the ground potential, for example. Spaces surrounded with the via conductors 30 are each filled with an insulator 33. The material of the insulator 33 may be, for example, but not limited to, resin.

As illustrated in FIG. 2, L1 is greater than L2, where L1 and L2 denote the length in a section, parallel to the first surface S1, of the via conductor 30 in a first direction along the periphery Ra of the resonance region R and in a second direction perpendicular to the periphery Ra, respectively. In the example of FIG. 2, because the periphery Ra is parallel to the X direction, the first direction is parallel to the X direction, and the second direction is parallel to the Y direction. In other words, when viewed in plan, the via conductors 30 each have an aspect ratio greater than 1. The via conductors 30 each have a major axis extending in the first direction and a minor axis extending in the second direction, and the via conductors 30 include a via conductor whose major axis extends along the periphery Ra of the resonance region R, connecting the via conductors 30 arranged in a line.

Note that, with regard to a part of the periphery Ra parallel to the Y direction, the first direction and the second direction are parallel to the Y direction and the X direction, respectively. Accordingly, for the via conductors 30 that are arranged along the part of the periphery Ra parallel to the Y direction, L1 is greater than L2, where L1 and L2 denote the length in the Y direction and the X direction, respectively.

The distance between two via conductors 30 adjacent to each other in the first direction is denoted by D. The distance D is less than ½ of the signal wavelength λc corresponding to the resonant frequency of the multilayer resonator 100. Herein, as illustrated in FIG. 2, the distance D is the shortest part among lengths between lateral surfaces of two adjacent via conductors.

The dielectric layer 10, the first conductor layer 21, the second conductor layer 22, and the via conductors 30 arranged as above constitute the multilayer resonator 100. A via conductor group composed of via conductors 30 serves as a side wall of the multilayer resonator 100. When the distance D between the via conductors 30 in the first direction is less than ½ of the signal wavelength λc as described above, electromagnetic waves at the resonant frequency do not pass through the side wall constructed of the via conductors 30 and are reflected. As a result, a standing wave is generated in the resonance region R surrounded with the first conductor layer 21, the second conductor layer 22, and the via conductors 30 and produces resonance in the resonance region R. The oscillation frequency and the oscillation mode of the standing wave are dictated by the capacitive component and the inductance component generated by each of these constituent elements. When transmission signals enter one of the first conductor layer 21 and the second conductor layer 22, signals of frequencies different from the resonant frequency are attenuated, and signals of the resonant frequency are extracted and picked up at the other conductor layer. This means that the multilayer resonator 100 functions as the multilayer filter 200 (a band-pass filter).

The configuration of the first conductor layer 21 and the second conductor layer 22 of the multilayer resonator 100 is not limited to the configuration illustrated in FIG. 1. For example, the first conductor layer 21 may be provided with a coplanar waveguide such that signals are transmitted through the coplanar waveguide. The first conductor layer 21 may serve as part of a microstrip line. More specifically, a dielectric member and a conductor layer may be layered on an upper surface of the first conductor layer 21 so that the layered conductor layer and the first conductor layer 21 constitute a microstrip line. Alternatively, the first conductor layer 21 may be in the form of a slot antenna, with another resonator formed on the upper surface of the first conductor layer 21. Electromagnetic waves propagating through the slot antenna electromagnetically couple the two or more resonators to each other. When the first conductor layer 21 and/or the second conductor layer 22 is provided with a pattern in the form of any kind of transmission line, the first conductor layer 21 and/or the second conductor layer 22 may have a part that is not electrically connected to the via conductors 30.

As described above, the printed wiring board 1 or, more specifically, the multilayer resonator 100 according to the present embodiment includes the dielectric layer 10, the first conductor layer 21, the second conductor layer 22, and the via conductors 30. The dielectric layer has the first surface S1 and the second surface S2 opposite to the first surface S1. The first conductor layer 21 lies in the first surface S1 of the dielectric layer 10. The second conductor layer 22 lies in the second surface S2 of the dielectric layer 10. The via conductors 30 each extend through the dielectric layer 10 from the first surface S1 to the second surface S2 and connect the first conductor layer 21 and the second conductor layer 22 to each other. The printed wiring board 1 includes the resonance region R. The resonance region R is surrounded with the via conductors and is the overlap between the first conductor layer 21 and the second conductor layer 22 in a transparent plan view. When viewed in plan, the via conductors 30 each have an aspect ratio greater than 1. The via conductors 30 each have a major axis extending in the first direction and a minor axis extending in the second direction, and the via conductors 30 include a via conductor whose major axis extends along the periphery Ra of the resonance region R connecting the via conductors arranged in a line.

When viewed from another perspective, the printed wiring board 1 or, more specifically, the multilayer resonator 100 according to the present embodiment includes the dielectric layer 10, the first conductor layer 21, the second conductor layer 22, and the via conductors 30. The first conductor layer 21 lies in the first surface S1 of the dielectric layer 10 and at least partially overlaps the resonance region R as a predetermined region, when viewed in plan in a direction perpendicular to the first surface S1. The second conductor layer 22 lies in the second surface S2 opposite to the first surface S1 of the dielectric layer 10 and at least partially overlaps the resonance region R when viewed in plan. The via conductors 30 are arranged so as to surround the resonance region R along the periphery Ra of the resonance region R when viewed in plan. The via conductors 30 each extend through the dielectric layer 10 from the first surface S1 to the second surface S2. With regard to each of the via conductors 30 in a section parallel to the first surface S1, the length in the first direction along the periphery Ra of the resonance region R is greater than the length in the second direction perpendicular to the periphery Ra.

This enables shortening of the distance D between the via conductors 30 in a side wall constituted by the via conductors 30. The side wall surrounding the resonance region R thus provides enhanced shielding against electromagnetic waves. The surface areas of the via conductors 30 in the present embodiment may each be larger than the surface area of a via conductor (hereinafter referred to as a round hole via conductor) in the related art that is circular in a section. This yields an improvement in thermal dissipation properties and provides greater rigidity in the printed wiring board 1.

The multilayer filter 200 includes the multilayer resonator 100 with the above-described configuration. With the enhanced shielding in the multilayer resonator 100, the multilayer filter 200 has excellent wavelength selection properties.

Next, variations of the embodiment are described. The following variations may be employed in combination.

Variation 1

The printed wiring board 1 in Variation 1 differs from the printed wiring board 1 in the embodiment in the shape of the via conductor 30 in a section. Variation 1 will be described below with a focus on the point different from the embodiment.

The shape of the via conductor 30 in a section is not limited to an ellipse illustrated in FIG. 2, and the via conductor 30 may have any shape in which the length L1 in the first direction is longer than the length L2 in the second direction.

Figure 3:
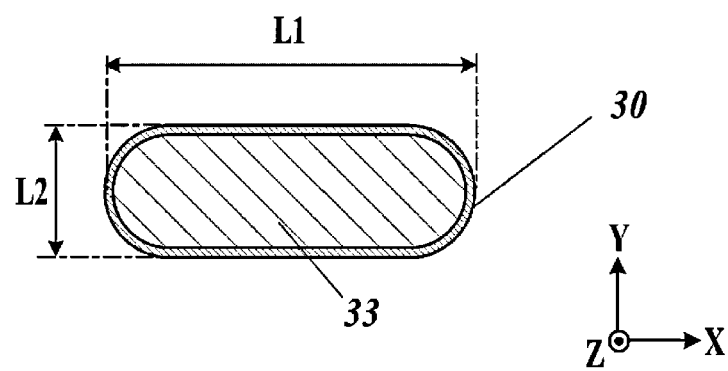
FIG. 3 is a view of a via conductor in Variation 1, illustrating an oblong section of the via conductor.

For example, as illustrated in FIG. 3, a section of the via conductor 30 parallel to the first surface S1 may be oblong (in the form of a racetrack) and extending in the first direction (the X direction in FIG. 3).

Figure 4:
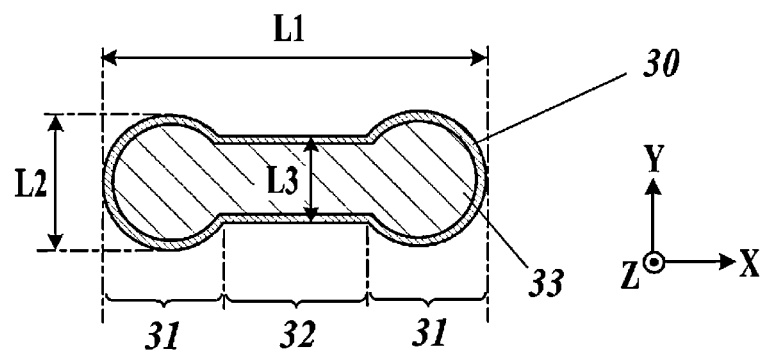
FIG. 4 is a view of a via conductor in Variation 1, illustrating a dumbbell-shaped section of the via conductor.

As illustrated in FIG. 4, a section of the via conductor 30 parallel to the first surface S1 may have a dumbbell-like shape. Herein, the dumbbell-like shape has end portions 31 opposite to each other in the first direction and a middle portion 32 which is a part of the via conductor 30 from which the end portions 31 are excluded. The end portion 31 on one side and the end portion 31 on the other side are circular, and the middle portion 32 is strip-shaped. In other words, the dumbbell-like shape has two circular end portions 31 and a strip-shaped middle portion 32, which has a width smaller than a diameter of each of the circular end portions 31 and connects the circular end portions 31 to each other. With regard to the dumbbell-like shape of the via conductor 30, the maximum width (length L3) of the middle portion 32 in the second direction (the Y direction in FIG. 4) is smaller than the maximum width (length L2) of each of the end portions 31 in the second direction.

Herein, when the via conductor 30 is in the form of a racetrack as illustrated in FIG. 3, the end portions are part of the via conductor 30 and the peripheries thereof are curved, and the middle portion is part between the end portions and the periphery thereof is defined by straight lines.

Figure 5:
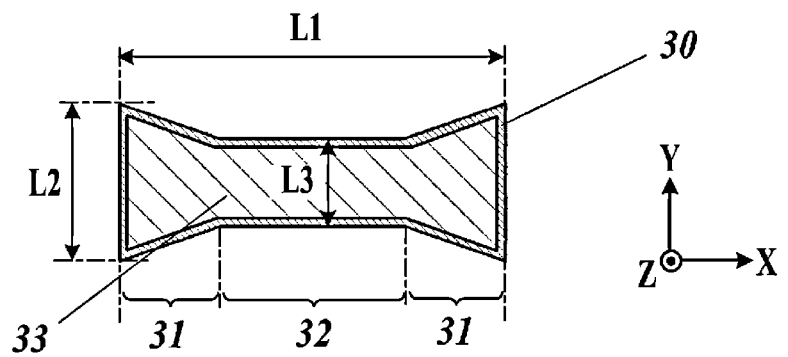
FIG. 5 is a view of another via conductor in Variation 1, illustrating a bow-tie-shaped section of the via conductor.

As illustrated in FIG. 5, a section of the via conductor 30 parallel to the first surface S1 may be bow-tie-shaped. Herein, when the via conductor 30 is bow-tie-shaped, the end portions 31 opposite to each other in the first direction are like a trapezoidal shape, and the middle portion 32, which is a part of the via conductor 30 from which the end portions 31 are excluded, is strip-shaped. Like a trapezoidal shape of each end portion 31 has a width in the second direction that increases with increasing proximity to the corresponding end in the first direction. With regard to the bow-tie-like shape of the via conductor 30, the maximum width (length L3) of the middle portion 32 in the second direction (the Y direction in FIG. 5) is smaller than the maximum width (length L2) of each of the end portions 31 in the second direction.

Advantageous effects same as and/or similar to those of the embodiment may be attained when the via conductors 30 in Variation 1 are used.

Variation 2

Variation 2 differs from the embodiment in that the printed wiring board 1 includes a third conductor layer 23. Variation 2 will be described below with a focus on the point different from the embodiment.

Figure 6:
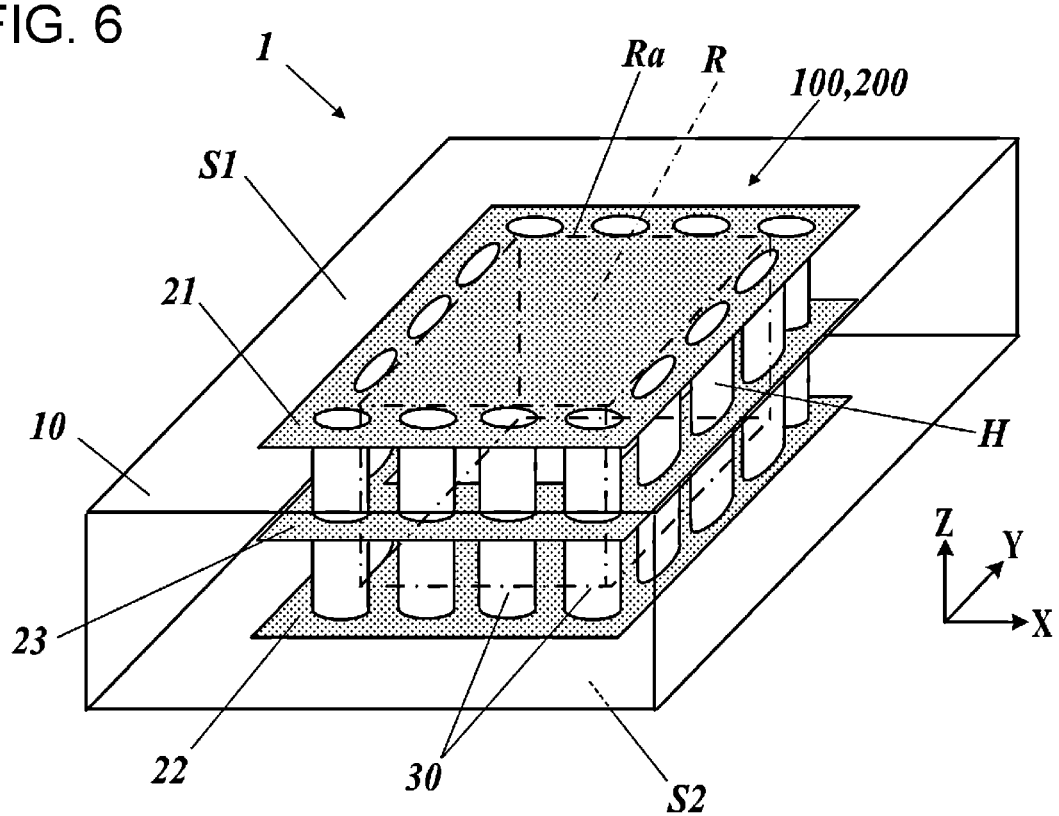
FIG. 6 is a transparent perspective view of a printed wiring board in Variation 2.

As illustrated in FIG. 6, the printed wiring board 1 in Variation 2 includes a third conductor layer 23 located between the first conductor layer 21 and the second conductor layer 22 in the dielectric layer 10 and extending in parallel to the first surface S1. The material of the third conductor layer 23 may be, for example, but not limited to, copper. The third conductor layer 23 is located within the dielectric layer 10 and may thus be referred to as an inner-layer conductor. The first conductor layer 21 and the second conductor layer 22 may be referred to as main conductor layers. The via conductors 30 each extend through the third conductor layer 23 and are electrically connected to the third conductor layer 23. The printed wiring board 1 may include two or more third conductor layers 23. By providing the third conductor layer 23, the effect of reflecting electromagnetic waves off the side wall of the multilayer resonator 100 can be enhanced.

In the example of FIG. 6, the third conductor layer 23 includes an opening, which is surrounded with the via conductors 30. However, the shape of the third conductor layer 23 is not limited to the shape illustrated in FIG. 6. For example, the third conductor layer 23 may be in the form of a slot antenna. In this case, portions adjacent to each other with the third conductor layer 23 therebetween serve as resonators. By propagating electromagnetic waves through the opening of the third conductor layer 23, two or more resonators are electromagnetically coupled to each other. The frequency selectivity of the multilayer filter 200 may be enhanced accordingly.

Variation 3

The printed wiring board 1 in Variation 3 differs from the printed wiring board 1 according to the embodiment in that two or more via conductors 30 are arranged side by side in the second direction. Variation 3 will be described below with a focus on the point different from the embodiment.

Figure 7:
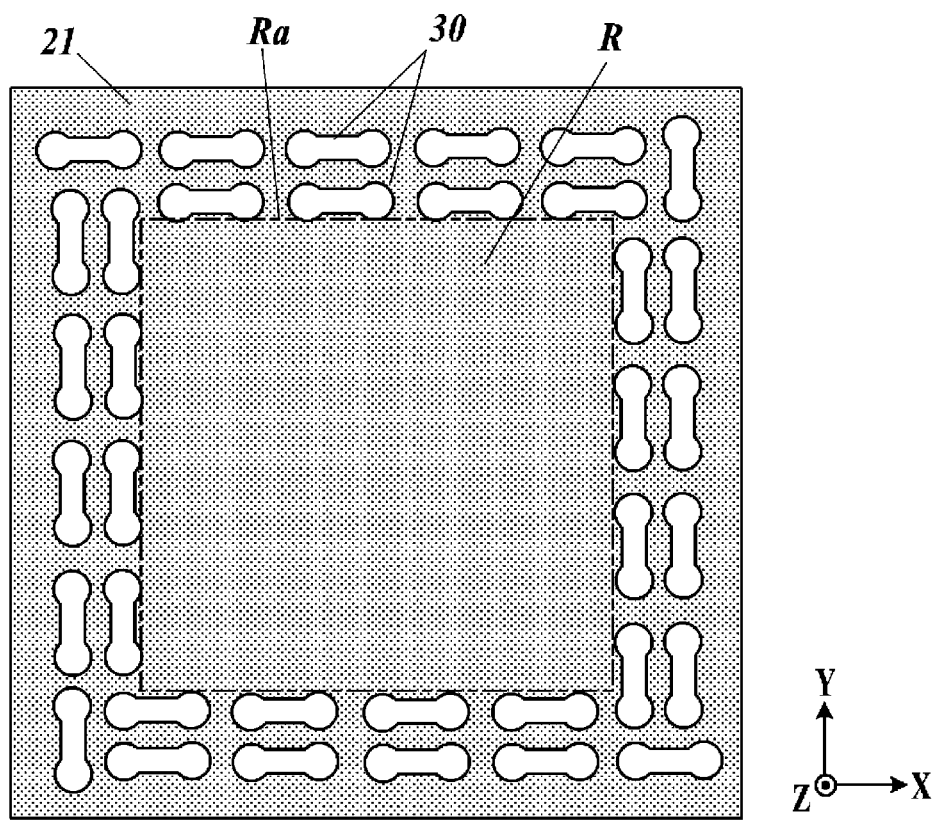
FIG. 7 is a plan view of a printed wiring board in Variation 3, illustrating an arrangement of via conductors of the printed wiring board.

As illustrated in FIG. 7, in the printed wiring board 1 in Variation 3, the via conductors are arranged so as to form a double rectangle along the periphery Ra of the resonance region R. That is, the via conductors 30 are arranged in a manner that two via conductors 30 are aligned side by side in the second direction perpendicular to the periphery Ra. The number of via conductors that are aligned side by side is not limited to two. Three or more via conductors 30 may be arranged side by side in the second direction. In other words, the via conductors 30 may be arranged so as to form a triple or more rectangle.

Further, the printed wiring board 1 in Variation 3 includes four third conductor layers 23 between the first conductor layer 21 and the second conductor layer 22. More specifically, the dielectric layer 10 includes five dielectric members respectively denoted by 11 to 15 and layered in the Z direction (see FIG. 9). Each of the third conductor layers 23 is formed at an interface between adjacent ones of the five dielectric members 11 to 15. The via conductors 30 each extend through the four third conductor layers 23.

Figure 8:
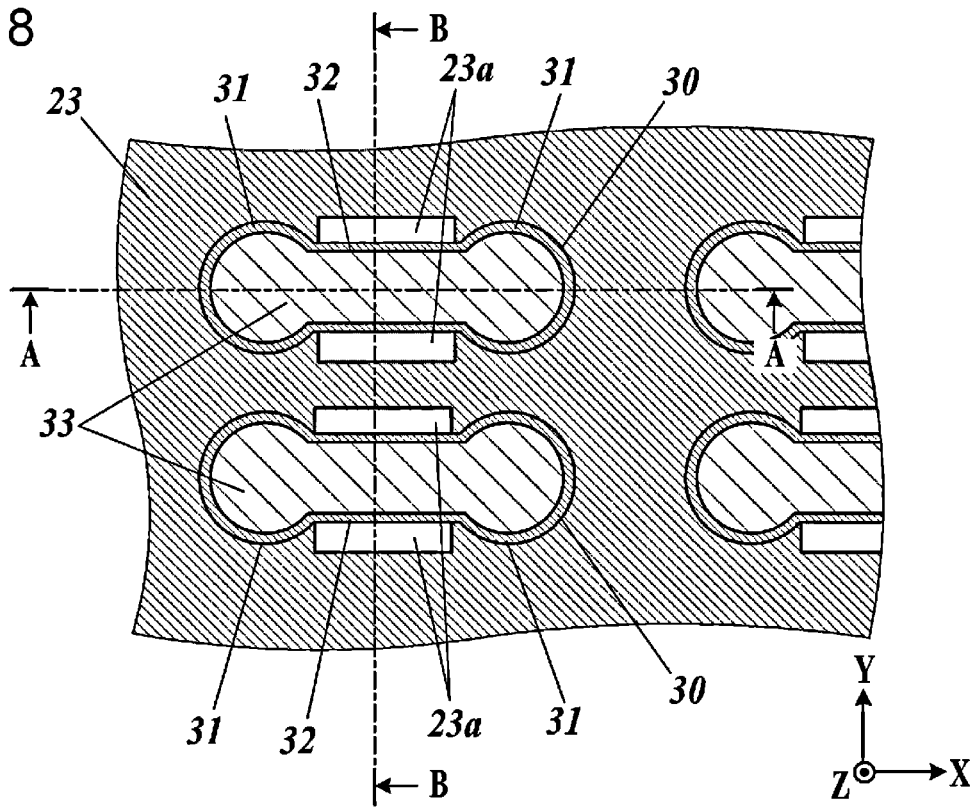
FIG. 8 is a view of the printed wiring board in Variation 3, illustrating a section parallel to a first surface at a position of a third conductor layer.

The following describes the connection between the third conductor layers 23 and the via conductors 30 while referring to FIG. 8. The end portions 31 of the via conductors 30 are in contact with the third conductor layers 23. In FIG. 8, the peripheries of the end portion 31 are entirely in contact with the third conductor layers 23. Alternatively, the peripheries of the end portions 31 may be partially in contact with the third conductor layers 23.

In contrast, the middle portions 32 of the via conductors 30 are separate from the third conductor layers 23. In other words, the third conductor layers 23 are located outside the boundaries at a predetermined distance from the middle portions 32 of the via conductors 30. A clearance 23a where the third conductor layer 23 is not formed is provided between the third conductor layer 23 and the middle portion 32. For example, the clearances 23a are cavities provided in the third conductor layers 23. The clearances 23a are filled with the material of the dielectric layer 10. Note that, each of the clearances 23a may be provided between part of the middle portions 32 and the third conductor layers 23.

Figure 9:
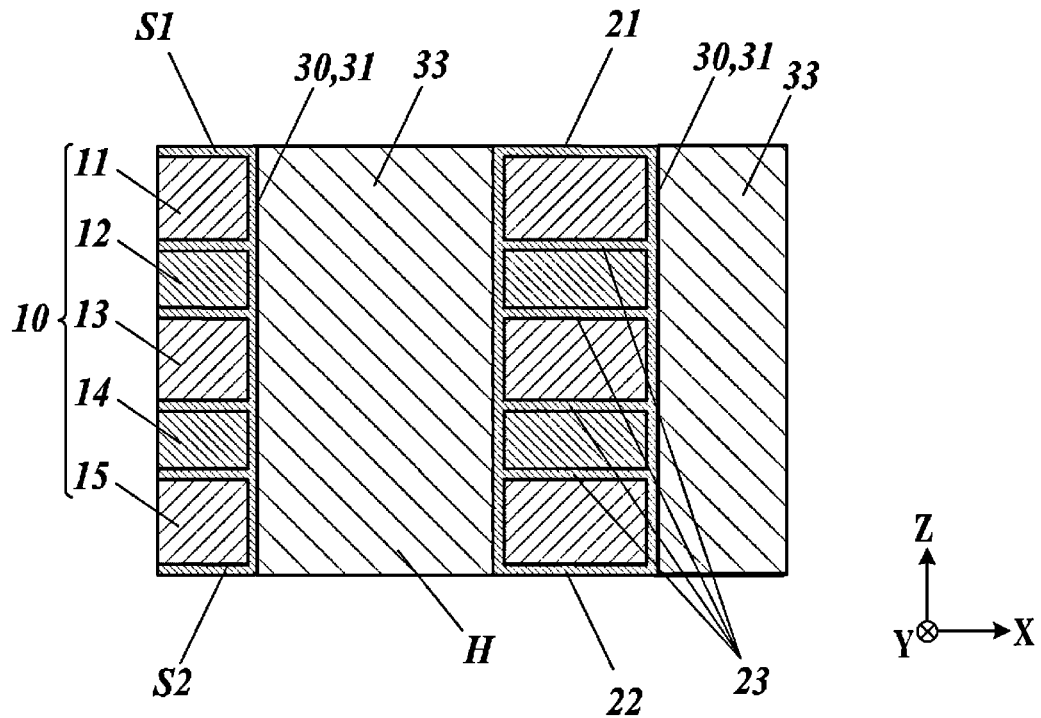
FIG. 9 is a view of the printed wiring board in Variation 3, illustrating a section perpendicular to a Y direction.

The positional relationship between the via conductors 30 and the third conductor layers 23 will be elaborated below while referring to sectional views of FIGS. 9 and 10. FIG. 9 illustrates a section that is taken along line A-A in FIG. 8 and is perpendicular to the Y direction. The line A-A passes through tips of the end portions 31 of the via conductors 30. As illustrated in FIG. 9, the end portions 31 are in contact with the third conductor layers 23. In a section passing through the end portions 31, wall surfaces of the via holes H where the via conductors 30 are formed extend in parallel to the Z direction. That is, portions of the via holes H where the end portions 31 are formed have a constant width in the second direction at respective positions in the thickness direction. Herein, having a constant width means that the difference between the width of the upper end of each via hole H and the width of the lower end of each via hole H falls within a range of 20 μm, inclusive of machining error.

Figure 10:
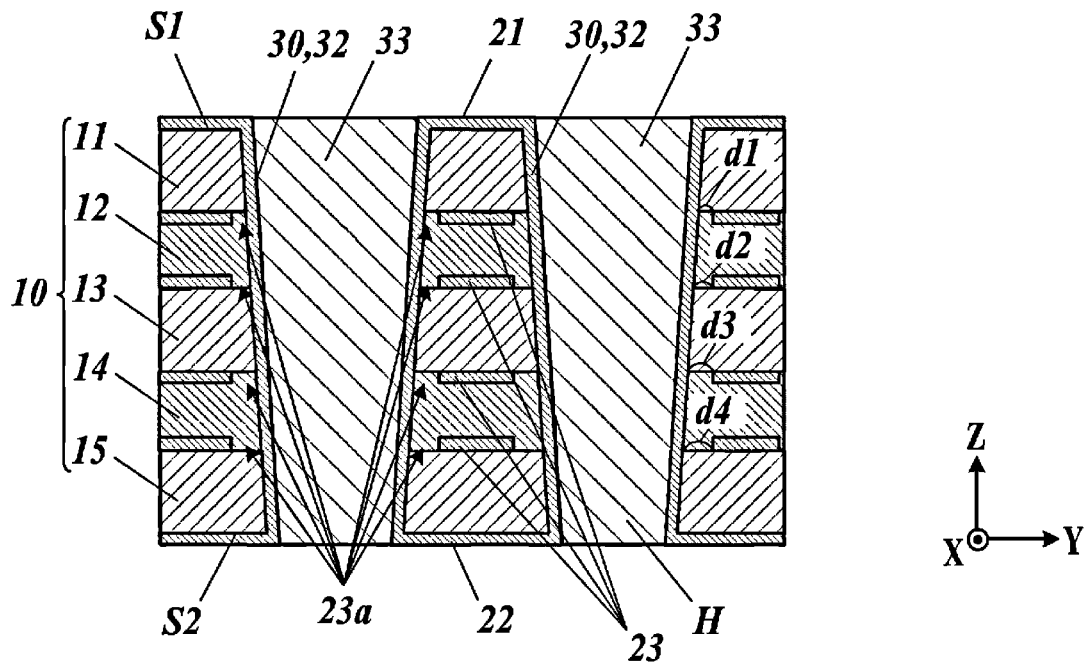
FIG. 10 is a view of the printed wiring board in Variation 3, illustrating a section perpendicular to an X direction.

FIG. 10 illustrates a section that is taken along line B-B in FIG. 8 and is perpendicular to the X direction. The line B-B passes through the middle portions 32 of two of the via conductors 30 in the width direction. As illustrated in FIG. 10, the middle portions 32 are separate from the third conductor layers 23; that is, the clearances 23a are provided between the middle portions 32 and the third conductor layers 23.

Each of the via conductors 30 has a shape in which the width of the middle portion 32 in the second direction (the Y direction in FIG. 10) gradually decreases with increasing distance from the first surface S1. In other words, the middle portions 32 in a section in FIG. 10 taper. On the other hand, the range in which the third conductor layers 23 are formed is identical when viewed in plan. Thus, the maximum value of distance between the via conductors 30 and the third conductor layers 23 in the second direction gradually increases with increasing distance from the first surface S1. More specifically, given that the four third conductor layers 23 are referred to as first to fourth layers in the order from closest to the first surface S1, the distance d2 between the second layer and the via conductor 30 is longer than the distance d1 (the width of the clearance 23a) between the first layer and the via conductor 30. The distance d3 between the third layer and the via conductor 30 is longer than the distance d2 between the second layer and the via conductor The distance d4 between the fourth layer and the via conductor 30 is longer than the distance d3 between the third layer and the via conductor 30. The distances d1 to d4 may each be, for example, not greater than $\frac{1}{10}$ of the signal wavelength λc corresponding to the resonant frequency.

Figure 11:
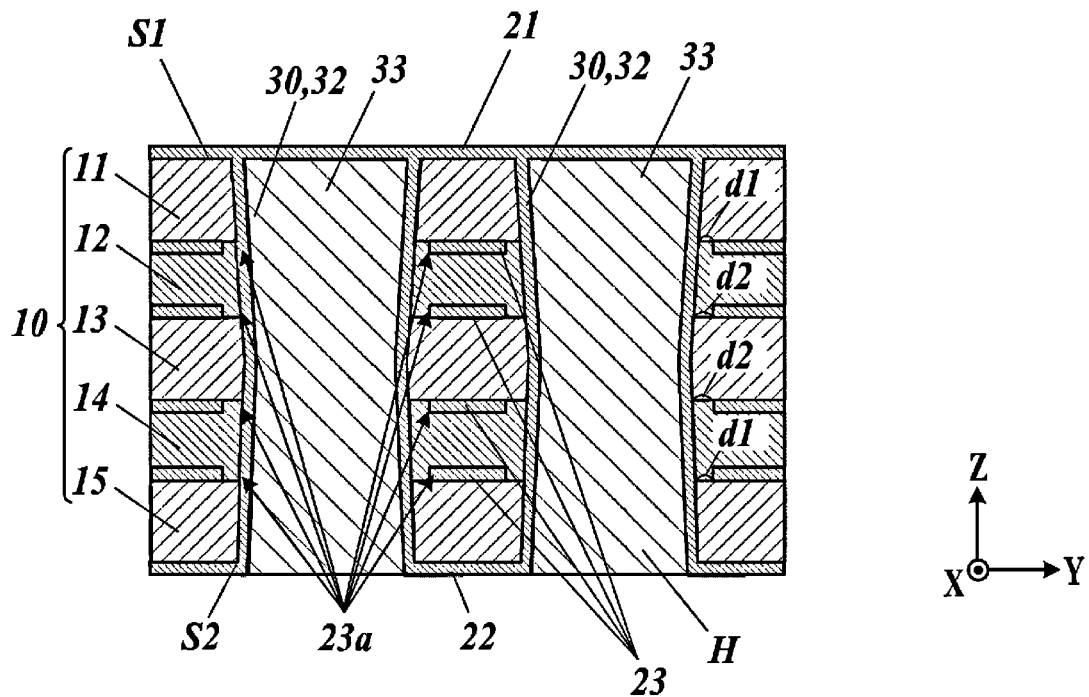
FIG. 11 is a view of the printed wiring board in Variation 3, illustrating another example of a section perpendicular to the X direction.

Note that, as an alternative to the configuration of FIG. 10, the configuration of FIG. 11 may be adopted. In FIG. 11, each of the via conductors 30 within a first distance range from the first surface S1 gradually decreases in width in the second direction with increasing distance from the first surface S1, and each of the via conductors 30 within a second distance range from the second surface S2 gradually decreases in width in the second direction with increasing distance from the second surface S2. Herein, the first distance range and the second distance range each may be, for example, but not limited to, half the thickness of the dielectric layer 10. When each of the first distance range and the second distance range is half the thickness of the dielectric layer the middle portions 32 of the via conductors 30 each have the smallest width at the midpoint in the thickness direction and increase in width with increasing proximity to the first surface S1 and the second surface S2.

In the first distance range from the first surface S1, the maximum value of distance between the via conductors 30 and the third conductor layers 23 in the second direction gradually increases with increasing distance from the first surface S1. In the second distance range from the second surface S2, the maximum value of distance between the via conductors 30 and the third conductor layers 23 in the second direction gradually increases with increasing distance from the second surface S2.

Note that, with each middle portion 32 being uniform in width throughout in the second direction irrespective of the distance from the first surface S1, the range in which the clearances 23a are formed may be varied with their distances from the first surface S1 so that the maximum value of the distance between the via conductors 30 and the third conductor layer 23 in the second direction gradually increases with increasing distance from the first surface S1.

As described above, the printed wiring board 1 in Variation 3 includes the third conductor layers 23 located between the first conductor layer 21 and the second conductor layer 22 and extending in parallel to the first surface S1. The via conductors 30 are provided in such a manner that two or more via conductors 30 are arranged side by side in the second direction. In each of the via conductors 30, the end portions 31 in the first direction are each at least partially in contact with the third conductor layers 23. The middle portion 32 which is a part of the via conductor 30 from which the end portions 31 are excluded is at least partially separate from the third conductor layers 23.

A section of each of the via conductors 30 in the present embodiment is long in the first direction. When such a via conductor is used, with regard to what is left after the via holes H are formed, part of the first conductor layer 21 adjacent to the via conductors 30 in the short-transverse direction is greater than part of the first conductor layer 21 adjacent to the via conductors 30 in the longitudinal direction. For this reason, the stress exerted on the via conductors 30 by the first conductor layer 21 is greater in the short-transverse direction than in the longitudinal direction; that is, an unbalanced stress distribution is created. The same goes for the second conductor layer 22. For example, stresses can be caused due to difference in thermal expansion coefficient between materials or other factors when the temperature changes in the printed wiring board 1.

To cope with this, in the present embodiment, the middle portions 32 of the via conductors 30 in the dielectric layer 10 are each at least partially separate from the third conductor layer 23 so that the stress exerted on the via conductors 30 in the short-transverse direction by the third conductor layer 23 will be reduced. The reduction in the stress exerted on the via conductors 30 in the short-transverse direction by the third conductor layers 23 cancels out the relative increase in the stress exerted on the via conductors 30 in the short-transverse direction by the first conductor layer 21 and the second conductor layer 22. As a result, the via conductors 30 under the stress exerted by the first conductor layer 21, the second conductor layer 22, and the third conductor layer 23 can thus achieve a better balance between the stress exerted in the short-transverse direction and the stress exerted in the longitudinal direction. Accordingly, occurrence of warpage or wire breakage caused by a stress imbalance can be reduced even in the case where the temperature changes in the printed wiring board 1.

The maximum width of the middle portion 32 of each of the via conductors 30 in the second direction in any section parallel to the first surface S1 is smaller than the maximum width of the end portions 31 in the second direction.

Accordingly, the via conductors 30 shaped as above take up less space. This provides the ease of creating the clearances 23a in a region adjoining the middle portions 32 such that the stress exerted on the via conductors 30 in the short-transverse direction by the third conductor layer 23 is more effectively reduced.

The printed wiring board 1 includes more than one third conductor layer 23. Each of the via conductors 30 has a shape in which the width of the middle portion 32 in the second direction gradually decreases with increasing distance from the first surface S1.

The positional relationship between the via conductors 30 and the third conductor layers 23 is as follows: the maximum value of distance (the clearance 23a) between the via conductors 30 and the third conductor layers 23 in a section parallel to the first surface S1 gradually increases with increasing distance from the first surface S1.

The stress exerted on the via conductors 30 undergoes attenuation due to deformations such as warpage and undulations, which are more likely to occur in a part of the printed wiring board 1 close to the first surface S1 and a part close to the second surface S2. Conversely, the stress exerted on the via conductors 30 is likely to be retained in the inner part of the printed wiring board 1, where deformations are less likely to occur. The configuration in which the middle portions 32 gradually decrease in width with increasing distance from the first surface S1 enables an increase in the width of the clearances 23a in the printed wiring board 1. Thus, the stress exerted on the via conductors 30 in the inner part of the printed wiring board 1 can be reduced, and occurrence of defects such as wire breakage can be reduced accordingly.

Variation 4

The printed wiring board 1 in Variation 4 differs from the printed wiring board 1 in Variation 3 in, for example, the arrangement of the via conductors 30 adjacent to each other in the second direction. Variation 4 will be described below with a focus on the point different from Variation 3.

Figure 12:
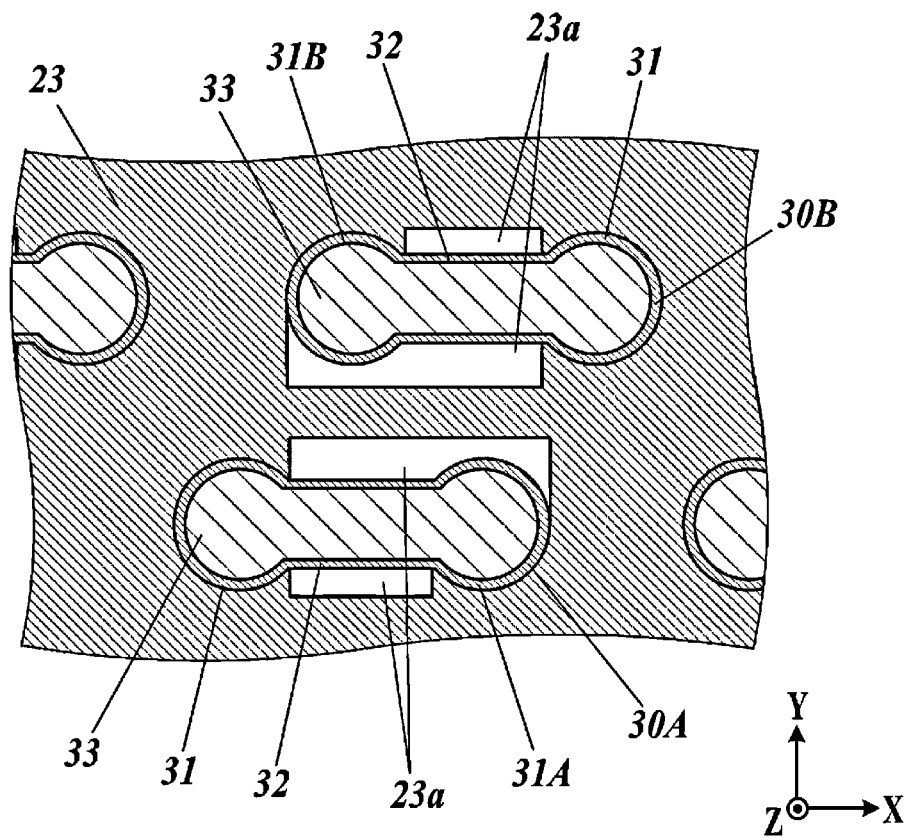
FIG. 12 is a view of a printed wiring board in Variation 4, illustrating a section parallel to a first surface at a position of a third conductor layer.

Referring to FIG. 12, the via conductors 30 on the −Y direction side in the figure are referred to as "first via conductors 30A", and the via conductors 30 adjacent to the first via conductor 30A in the second direction (the Y direction in FIG. 12) are referred to as "second via conductors 30W". The first via conductors 30A and the second via conductors 30B in the printed wiring board 1 in Variation 4 are arranged in a staggered pattern, with the first via conductors 30A and the second via conductors 30B being shifted from each other in the first direction (the X direction in FIG. 12). More specifically, one of maximum width end portions 31A of the first via conductor 30A and at least part of the middle portion 32 of the second via conductor 30B face each other in the second direction. The above positional relationship can be rewritten as follows: one of end portions 31B of the second via conductor 30B and at least part of the middle portion 32 of the first via conductor 30A face each other in the second direction.

The end portion 31A of the first via conductor 30A has a surface that faces the middle portion 32 of the second via conductor 30B, and the surface is at least partially separate from the third conductor layer 23. Likewise, the end portion 31B of the second via conductor 30B has a surface that faces the middle portion 32 of the first via conductor 30A, and the surface is at least partially separate from the third conductor layer 23.

In other words, the clearance 23a that adjoins to the first via conductor 30A closer to the second via conductor 30B extends all along the middle portion 32 and the end portion 31A. The clearance 23a that adjoins to the second via conductor 30B closer to the first via conductor 30A extends all along the middle portion 32 and the end portion 31B.

When viewed from another perspective, this can be described as follows: part of one of two via conductors 30 adjacent to each other in the second direction faces the other via conductor 30, and the entirety of the part adjoins the clearance 23a.

As described above, in the printed wiring board 1 in Variation 4, the via conductors 30 are arranged in a positional relationship defined as follows. One of two end portions 31 of each of the first via conductors 30 of the via conductors 30 and at least part of the middle portion 32 of the corresponding one of the second via conductors 30 adjacent to the first via conductor 30 in the second direction face each other in the second direction. The end portion 31 of each of the first via conductors 30 has a surface that faces the middle portion 32 of the corresponding one of the second via conductors 30, and the surface is at least partially separate from the third conductor layers 23.

With the via conductors 30 being arranged in a staggered pattern, the via conductors 30 adjacent to each other in the second direction serve as a shield against electromagnetic waves leaking out between the via conductors 30 adjacent to each other in the first direction. The shielding effect is further enhanced accordingly. The end portions 31 of the via conductors 30 adjoin the clearances 23a such that the stress exerted on the via conductors 30 in the short-transverse direction by the third conductor layer 23 is further reduced.

Procedure for Manufacturing Printed Wiring Board

Next, an example of a procedure for manufacturing the printed wiring board 1 will be described below. In this example, the via conductors 30 each have a dumbbell-like shape.

Figure 13A:
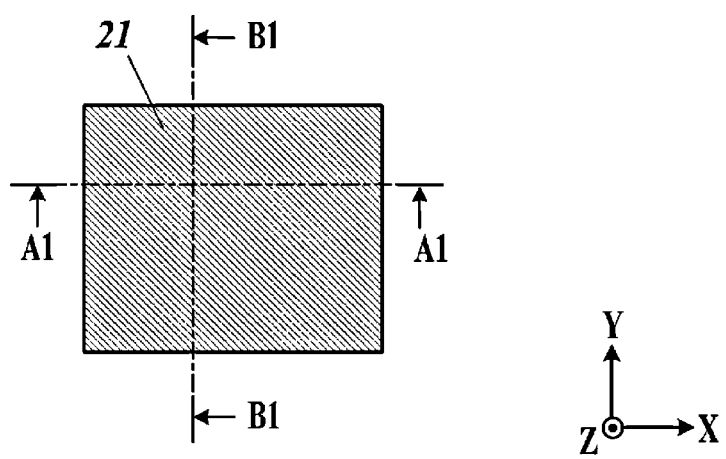
FIG. 13A is a plan view for explaining a procedure for manufacturing a printed wiring board.
Figure 13B:
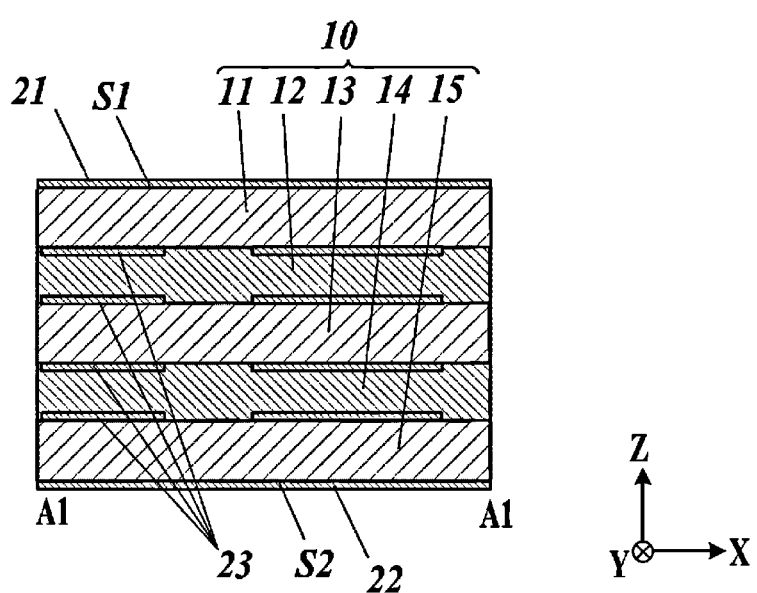
FIG. 13B is a view illustrating a section that is taken along line A1-A1 in FIG. 13A and is perpendicular to the Y direction.
Figure 13C:
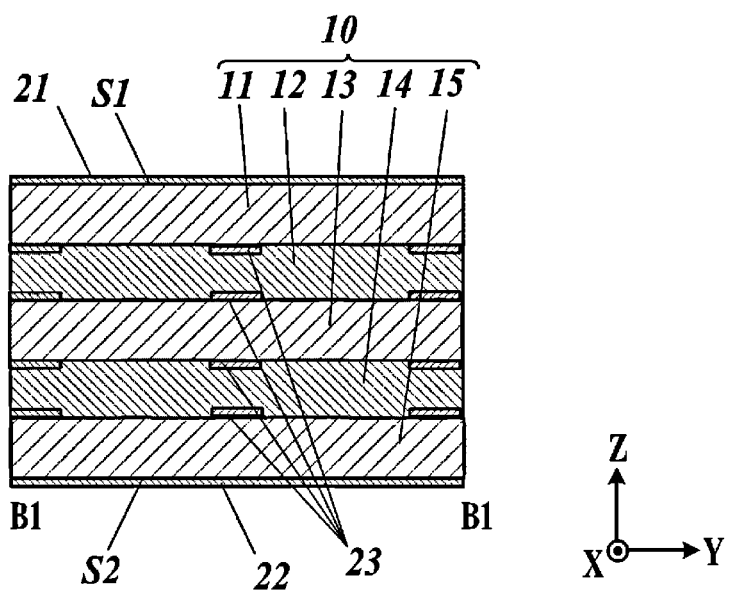
FIG. 13C is a view illustrating a section that is taken along line B1-B1 in FIG. 13A and is perpendicular to the X direction.

As illustrated in FIGS. 13A to 13C, a multilayer body is manufactured. The multilayer body includes the dielectric layer 10, the first conductor layer 21, the second conductor layer 22, and the four third conductor layers 23. The dielectric layer 10 includes five layered dielectric members 11 to 15.

More specifically, the dielectric members 11, 13, and 15 that are each in the form of a plate (a copper-clad laminate) with copper foil on both sides are prepared. The copper foil on an upper surface of the dielectric member 11 is the first conductor layer 21, and the copper foil on a lower surface of the dielectric member 11 is the first layer that is one of the third conductor layers 23. The copper foil on an upper surface of the dielectric member 13 is the second layer that is another one of the third conductor layers 23, and the copper foil on a lower surface of the dielectric member 13 is the third layer that is still another one of the third conductor layers 23. The copper foil on an upper surface of the dielectric member 15 is the fourth layer that is yet another one of the third conductor layers 23, and the copper foil on a lower surface of the dielectric member 15 is the second conductor layer 22. In preparation for creating the clearances 23a, openings are formed in advance by patterning in the copper foil used as the material of the third conductor layers 23. The technique used for this patterning may be, for example, photolithography. The dielectric member 11 and the dielectric member 13 are then layered with the dielectric member 12 as a prepreg therebetween. Likewise, the dielectric member 13 and the dielectric member 15 are layered with the dielectric member 14 as a prepreg therebetween. Herein, the prepregs are each obtained by semi-curing a piece of glass cloth impregnated with resin. The structure obtained as above is heated and pressed in the Z direction. Consequently, the resin in the prepregs melts and is then cured such that the dielectric members 12 and 14 harden. In this way, the structure is formed into the multilayer body illustrated in FIGS. 13A to 13C.

Figure 14A:
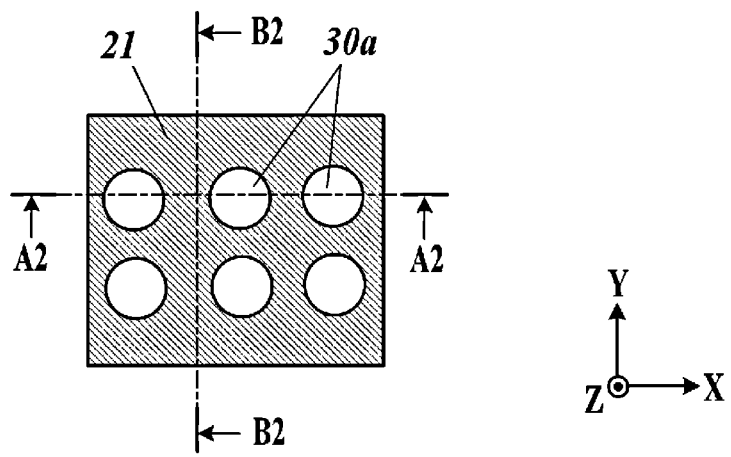
FIG. 14A is a plan view for explaining the procedure for manufacturing a printed wiring board.
Figure 14B:
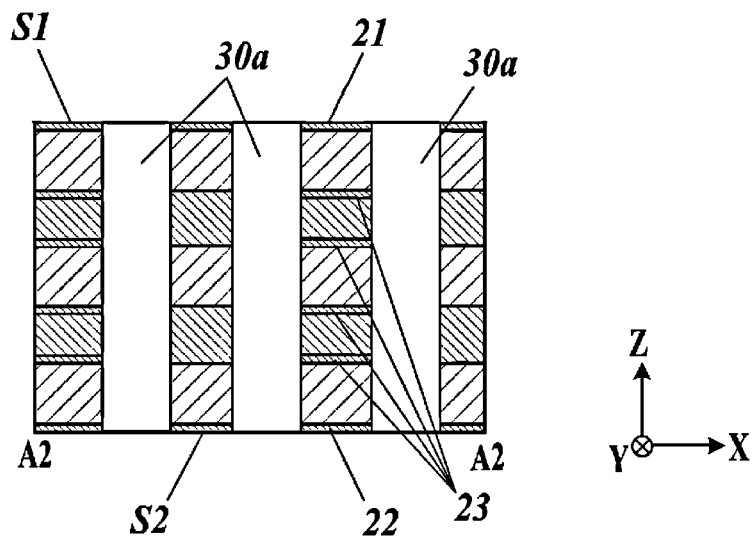
FIG. 14B is a view illustrating a section that is taken along line A2-A2 in FIG. 14A and is perpendicular to the Y direction.
Figure 14C:
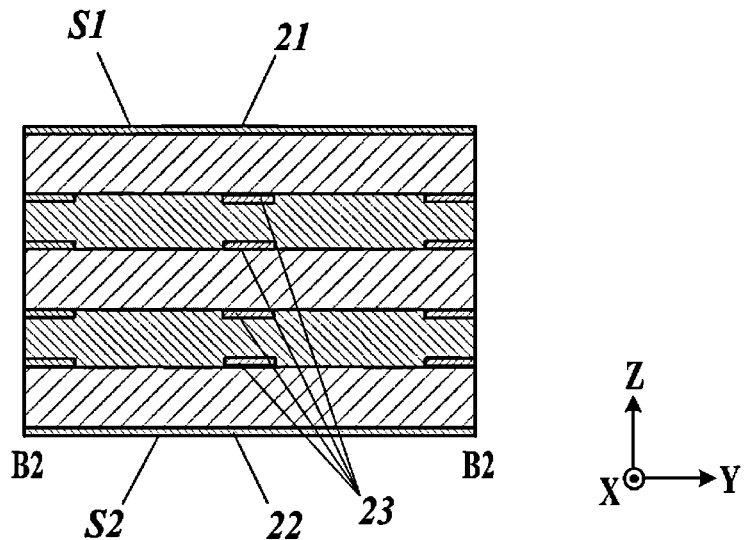
FIG. 14C is a view illustrating a section that is taken along line B2-B2 in FIG. 14A and is perpendicular to the X direction.

Next, as illustrated in FIGS. 14A to 14C, through-holes 30a are formed in the planned site of the end portions 31 of the via conductors 30 by drilling process. In this case, the through-holes 30a each have a wall surface extending in parallel to the Z direction.

Figure 15A:
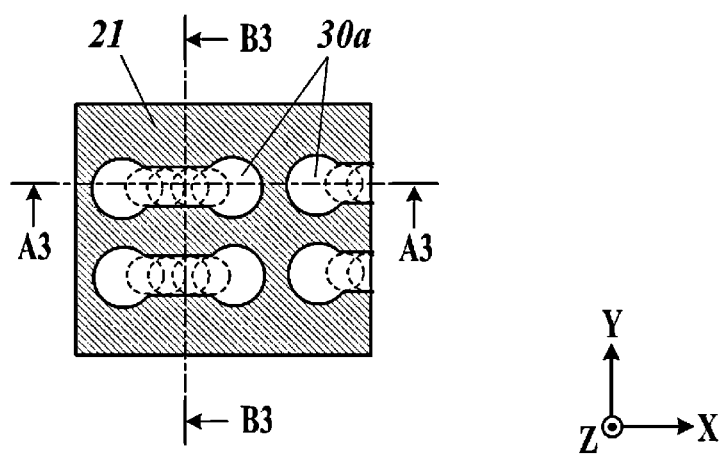
FIG. 15A is a plan view for explaining the procedure for manufacturing a printed wiring board.
Figure 15B:
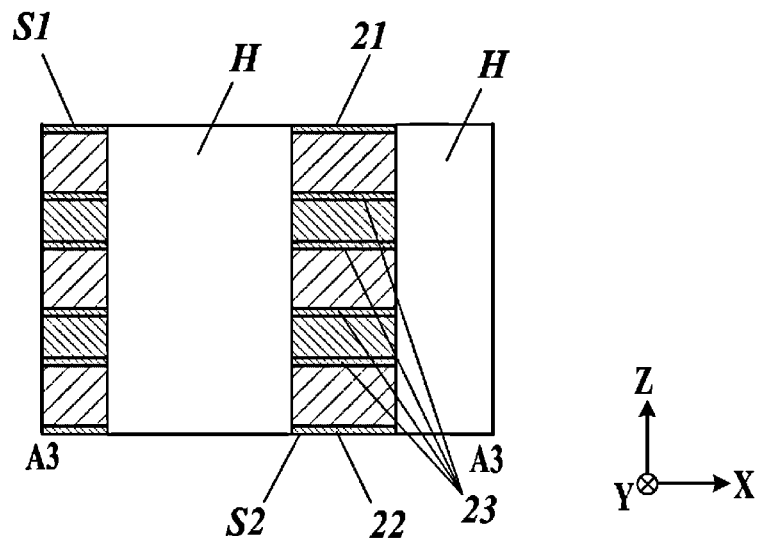
FIG. 15B illustrates a section that is taken along line A3-A3 in FIG. 15A and is perpendicular to the Y direction.
Figure 15C:
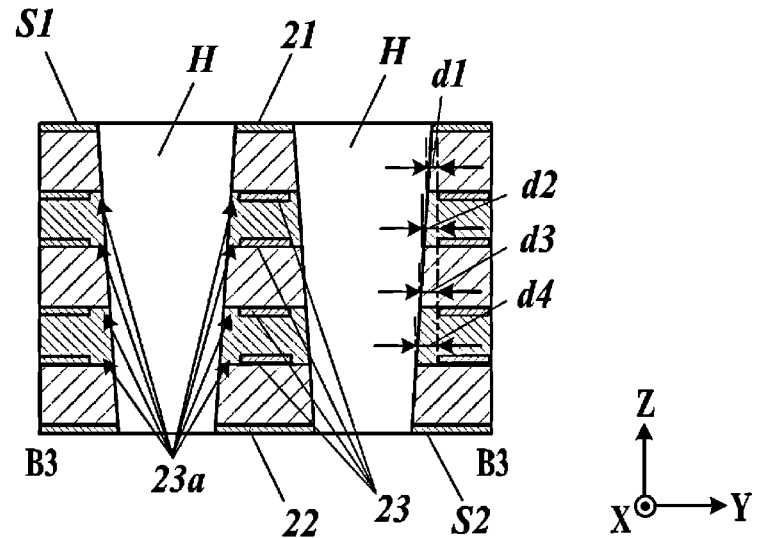
FIG. 15C is a view illustrating a section that is taken along line B3-B3 in FIG. 15A and is perpendicular to the X direction.

Next, as illustrated in FIGS. 15A to 15C, drilling process is carried out multiple times on the regions between adjacent ones of the through-holes 30a, that is, on the planned site of the middle portion 32 of the via conductors 30. Accordingly, the via holes H are formed with the adjacent through-holes 30a being connected to each other. More specifically, through-holes smaller in diameter than the through-holes 30a are drilled into dotted-line encircled portions in FIG. 15A to connect the through-holes 30a to each other. The dotted-line encircled portions in FIG. 15A are narrower than the width of the openings (the clearances 23a) in the third conductor layers 23. Accordingly, as illustrated in FIG. 15C, portions of wall surface of the via holes H corresponding to the middle portions 32 are separate from the third conductor layers 23 and the clearances 23a are defined. This drilling process is carried out by using a drill shaped like a reamer. The portion of the via holes H corresponding to the middle portion 32 has a shape whose width in the second direction (the Y direction in FIG. 15C) gradually decreases with increasing distance from the first surface S1, as illustrated in FIG. 15C. Accordingly, the width of the clearances 23a in the second direction gradually increases with increasing distance from the first surface S1. Further, as illustrated in FIG. 11, the midsections of the via holes H in the thickness direction are at the minimum width of the respective via holes H. Such a via hole may be obtained by drilling a hole into both the upper surface and the lower surface of the multilayer body with a drill shaped like a reamer.

Figure 16A:
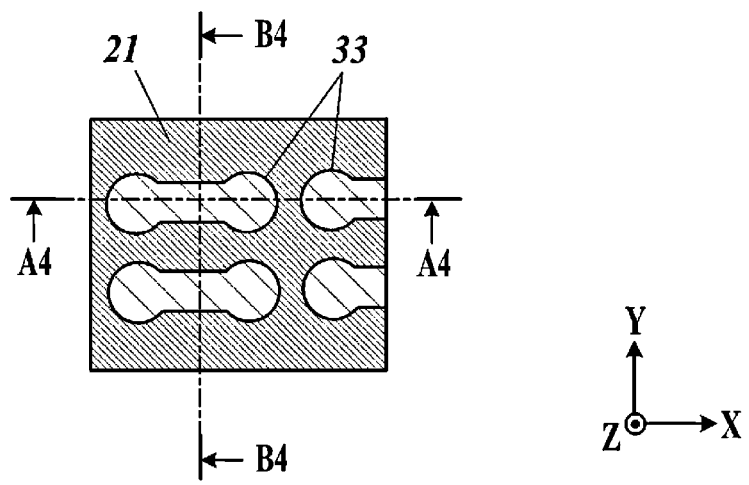
FIG. 16A is a plan view for explaining the procedure for manufacturing a printed wiring board.
Figure 16B:
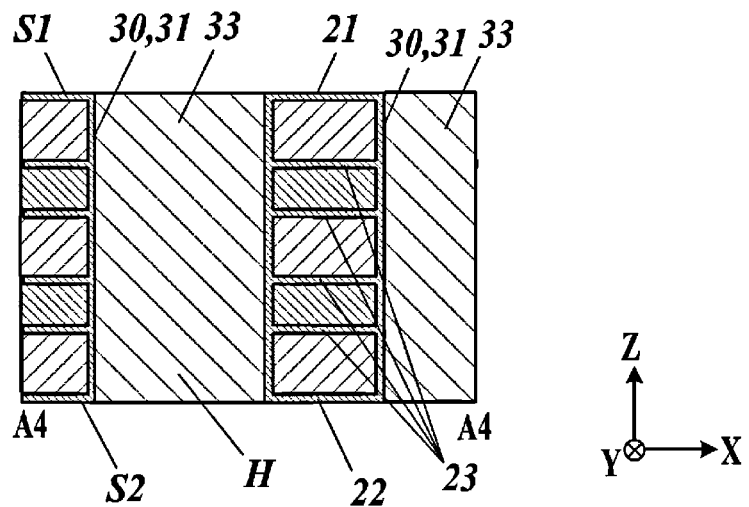
FIG. 16B is a view illustrating a section that is taken along line A4-A4 in FIG. 16A and is perpendicular to the Y direction.
Figure 16C:
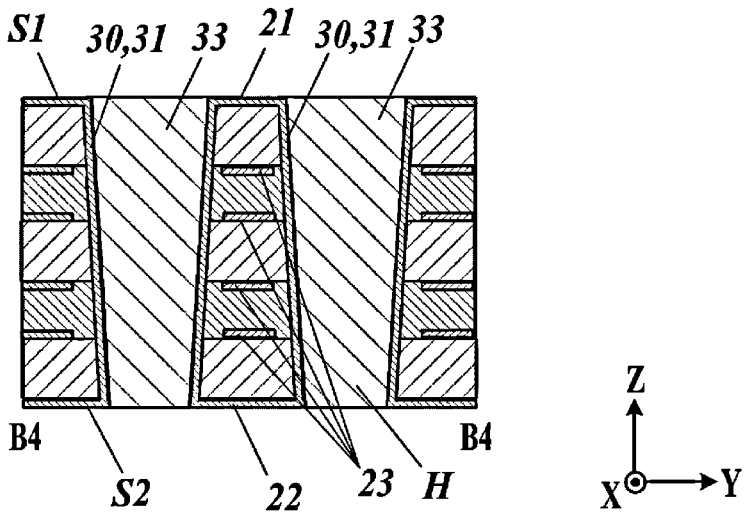
FIG. 16C is a view illustrating a section that is taken along line B4-B4 in FIG. 16A and is perpendicular to the X direction.

Next, as illustrated in FIGS. 16A to 16C, plating is applied to the multilayer body to form the via conductors 30 on the wall surfaces of the via holes H. The spaces surrounded with the via conductors 30 are then each filled with the insulator 33 (e.g., resin). The printed wiring board 1 is obtained by the procedure that has been described so far.

When round hole via conductors in the related art are used, the diameter of the via conductor is to be small to reduce the space occupied by the via conductor. If size reduction in diameter of the via conductors is conducted, the aspect ratio of each of the round via conductors would be high; that is, the ratio of the length of each round hole via conductor in the Z direction to the diameter of each round hole via conductor would be large. This would make it difficult to distribute a plating solution, so that the inner walls of the via holes would not be plated properly.

On the other hand, in the present embodiment, a section of each of the via conductors 30 is longer in the first direction than in the second direction. Accordingly, if the length of the via conductors 30 in the short-transverse direction is equal to the diameter of the round hole via conductors, the aspect ratio in the longitudinal direction is lower than the aspect ratio of the round hole via conductors. This improves the ease of applying a plating solution to the via holes H and, a plating layer (the via conductors 30) of desired thickness can be formed. The occurrence of defects such as wire breakage is reduced accordingly. The multilayer resonator 100 is less prone to defects and the multilayer filter 200 and the printed wiring board 1 incorporating such a multilayer resonator 100 have excellent durability.

Specific details such as the configurations, structures, positional relationships, and shapes illustrated in the above embodiment can be changed as appropriate so long as the changes do not depart from the spirit of the present disclosure. The configurations, structures, positional relationships, and shapes illustrated in the above embodiment can be combined with one another as appropriate so long as the resulting combinations do not depart from the spirit of the present disclosure.

INDUSTRIAL APPLICABILITY

The present disclosure is applicable to a printed wiring board, a multilayer resonator, and a multilayer filter.

REFERENCE SIGNS 1 printed wiring board
10 dielectric layer
11 to 15 dielectric member
21 first conductor layer
22 second conductor layer
23 third conductor layer
23a clearance
30 via conductor
30A first via conductor
30B second via conductor
30a through-hole
31, 31A, 31B end portion
32 middle portion
33 insulator
100 multilayer resonator
200 multilayer filter
H via hole
R resonance region (predetermined region)
Ra periphery
S1 first surface
S2 second surface

The invention claimed is:
1. A printed wiring board comprising:
a dielectric layer;
a first conductor layer;
a second conductor layer; and
a plurality of via conductors,
wherein
the dielectric layer has a first surface and a second surface opposite to the first surface,
the first conductor layer lies in the first surface of the dielectric layer,
the second conductor layer lies in the second surface of the dielectric layer,
the plurality of via conductors each extend through the dielectric layer from the first surface to the second surface and connect the first conductor layer and the second conductor layer to each other,
part of the printed wiring board is surrounded with the plurality of via conductors and is an overlap between the first conductor layer and the second conductor layer in a transparent plan view,
when viewed in plan, the plurality of via conductors each have an aspect ratio greater than 1 and each have a major axis extending in a first direction and a minor axis extending in a second direction, and
the plurality of via conductors comprise a via conductor whose major axis extends along a periphery connecting the plurality of via conductors arranged in a line, the printed wiring board further comprising a third conductor layer located between the first conductor layer and the second conductor layer and extending in parallel to the first surface, wherein two or more of the plurality of via conductors are arranged side by side in the second direction, and in each of the plurality of via conductors, an end portion in the first direction is at least partially in contact with the third conductor layer, and a middle portion which is a part of each of the plurality of via conductors from which the end portion is excluded is at least partially separate from the third conductor layer.

2. The printed wiring board according to claim 1, further comprising one or more third conductor layers, wherein the plurality of via conductors and the one or more third conductor layers are arranged in a manner that maximum value of distance between the plurality of via conductors and the one or more third conductor layers in a section parallel to the first surface gradually increases with increasing distance from the first surface.

3. The printed wiring board according to claim 1, wherein a maximum width of the middle portion of each of the plurality of via conductors in the second direction in any section parallel to the first surface is smaller than a maximum width of the end portion in the second direction.

4. The printed wiring board according to claim 3, wherein, the plurality of via conductors are arranged in a manner that the end portion on one side of a first via conductor of the plurality of via conductors and at least part of the middle portion of a second via conductor of the plurality of via conductors face each other in the second direction, the second via conductor being adjacent to the first via conductor in the second direction, the end portion of the first via conductor has a surface that faces the middle portion of the second via conductor, and the surface is at least partially separate from the third conductor layer.

5. The printed wiring board according to claim 1, further comprising one or more third conductor layers, wherein each of the plurality of via conductors has a shape in which a width of the middle portion in the second direction gradually decreases with increasing distance from the first surface.

6. A multilayer resonator comprising:

a dielectric layer;

a first conductor layer;

a second conductor layer;

a plurality of via conductors, wherein the dielectric layer has a first surface and a second surface opposite to the first surface, the first conductor layer lies in the first surface of the dielectric layer, the second conductor layer lies in the second surface of the dielectric layer, the plurality of via conductors each extend through the dielectric layer from the first surface to the second surface and connect the first conductor layer and the second conductor layer to each other, part that is surrounded with the plurality of via conductors and that is an overlap between the first conductor layer and the second conductor layer in a transparent plan view is provided, when viewed in plan, the plurality of via conductors each have an aspect ratio greater than 1 and each have a major axis extending in a first direction and a minor axis extending in a second direction, and the plurality of via conductors comprise a via conductor whose major axis extends along a periphery connecting the plurality of via conductors arranged in a line, the multilayer resonator further comprising a third conductor layer located between the first conductor layer and the second conductor layer and extending in parallel to the first surface, wherein two or more of the plurality of via conductors are arranged side by side in the second direction, and in each of the plurality of via conductors, an end portion in the first direction is at least partially in contact with the third conductor layer, and a middle portion which is a part of each of the plurality of via conductors from which the end portion is excluded is at least partially separate from the third conductor layer.

7. A multilayer filter comprising the multilayer resonator according to claim 6.

* * * * *